(12) United States Patent
Kim et al.

(10) Patent No.: US 8,598,780 B2
(45) Date of Patent: Dec. 3, 2013

(54) ORGANIC LIGHT EMITTING DISPLAY AND FABRICATION METHOD THEREOF

(75) Inventors: Jong-Yun Kim, Yongin-si (KR); Byoung-Deog Choi, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 870 days.

(21) Appl. No.: 11/785,101

(22) Filed: Apr. 13, 2007

(65) Prior Publication Data
US 2008/0111477 A1    May 15, 2008

(30) Foreign Application Priority Data
Nov. 10, 2006  (KR) .................. 10-2006-0111300

(51) Int. Cl.
*H01J 1/62*    (2006.01)
*H05B 33/00*   (2006.01)

(52) U.S. Cl.
USPC .................. 313/504; 313/506; 445/23

(58) Field of Classification Search
USPC ........ 313/506, 512, 504; 445/23–25; 428/690
See application file for complete search history.

(56) References Cited

U.S. PATENT DOCUMENTS

| | | | |
|---|---|---|---|
| 4,735,847 A | 4/1988 | Fujiwara et al. | |
| 5,504,605 A | 4/1996 | Sakuma et al. | |
| 5,811,866 A | 9/1998 | Hirata | |
| 5,986,401 A | 11/1999 | Thompson et al. | |
| 5,998,919 A * | 12/1999 | Yoo et al. ...................... | 313/479 |
| 6,518,700 B1 * | 2/2003 | Friend et al. .................. | 313/504 |
| 6,559,594 B2 | 5/2003 | Fukunaga et al. | |
| 6,597,113 B1 | 7/2003 | Nitta | |
| 6,815,240 B2 * | 11/2004 | Hayashi .......................... | 438/30 |
| 7,083,863 B2 | 8/2006 | Satou et al. | |
| 7,223,636 B2 | 5/2007 | Kobayashi et al. | |
| 7,276,291 B2 | 10/2007 | Bright | |
| 2001/0011868 A1 | 8/2001 | Fukunaga et al. | |
| 2003/0010062 A1 | 1/2003 | Matthies | |
| 2003/0020124 A1 | 1/2003 | Guenther | |
| 2003/0082889 A1 | 5/2003 | Maruyama et al. | |
| 2003/0094894 A1 | 5/2003 | Andry et al. | |

(Continued)

FOREIGN PATENT DOCUMENTS

| | | |
|---|---|---|
| CN | 1423513 | 5/2003 |
| CN | 1450837 A | 10/2003 |

(Continued)

OTHER PUBLICATIONS

Japanese Notice of Allowance issued by JPO, dated Jan. 25, 2011, corresponding to Japanese Patent Application No. 2007-109771.

(Continued)

*Primary Examiner* — Joseph L Williams
(74) *Attorney, Agent, or Firm* — Robert E. Bushnell, Esq.

(57) ABSTRACT

An organic light emitting display having a small thickness and a fabrication method thereof are provided. The organic light emitting display includes a substrate, an non-transmissive layer formed on the substrate, a semiconductor layer formed on the non-transmissive layer, a gate insulation layer formed on the semiconductor layer, a gate electrode formed on the gate insulation layer, an inter-layer dielectric layer formed on the gate electrode, a source/drain electrode formed on the inter-layer dielectric layer, an insulation layer formed on the source/drain electrode, and an organic light emitting diode formed on the insulation layer.

22 Claims, 8 Drawing Sheets

(56) References Cited

U.S. PATENT DOCUMENTS

| | | |
|---|---|---|
| 2003/0107326 A1* | 6/2003 | Park et al. .................. 315/169.3 |
| 2003/0117071 A1* | 6/2003 | Lee et al. ..................... 313/512 |
| 2003/0155860 A1 | 8/2003 | Choi et al. |
| 2003/0230971 A1 | 12/2003 | Arakawa et al. |
| 2004/0129960 A1 | 7/2004 | Maruyama et al. |
| 2004/0135148 A1 | 7/2004 | Lin |
| 2004/0135164 A1 | 7/2004 | Park et al. |
| 2004/0178723 A1 | 9/2004 | Yasukawa et al. |
| 2004/0191963 A1 | 9/2004 | Pichler |
| 2004/0251827 A1 | 12/2004 | Kang et al. |
| 2004/0253838 A1 | 12/2004 | Yamazaki et al. |
| 2005/0002081 A1 | 1/2005 | Beteille et al. |
| 2005/0029926 A1 | 2/2005 | Park et al. |
| 2005/0045917 A1 | 3/2005 | Yamazaki et al. |
| 2005/0046340 A1 | 3/2005 | Kohara et al. |
| 2005/0046783 A1 | 3/2005 | Kawata et al. |
| 2005/0067945 A1* | 3/2005 | Nishikawa et al. ........... 313/501 |
| 2005/0067950 A1 | 3/2005 | Nonoue et al. |
| 2005/0101052 A1 | 5/2005 | Kobayashi et al. |
| 2005/0164470 A1 | 7/2005 | Yamazaki et al. |
| 2005/0211990 A1 | 9/2005 | Lee et al. |
| 2005/0218409 A1 | 10/2005 | Um et al. |
| 2005/0285522 A1 | 12/2005 | Han et al. |
| 2006/0181221 A1* | 8/2006 | Sato ......................... 315/169.3 |
| 2007/0048895 A1 | 3/2007 | Suginoya et al. |
| 2008/0111125 A1 | 5/2008 | Kim |
| 2008/0111126 A1 | 5/2008 | Kim |
| 2008/0111477 A1 | 5/2008 | Kim et al. |
| 2008/0128683 A1 | 6/2008 | Kim et al. |
| 2008/0142791 A1 | 6/2008 | Kim et al. |

FOREIGN PATENT DOCUMENTS

| | | |
|---|---|---|
| EP | 1584971 A1 | 10/2005 |
| JP | 198417810 B | 4/1984 |
| JP | 09211482 A | 8/1997 |
| JP | 10221700 | 8/1998 |
| JP | 2000150145 | 5/2000 |
| JP | 2000268735 | 9/2000 |
| JP | 2000298264 A | 10/2000 |
| JP | 2001053290 | 2/2001 |
| JP | 2001319776 | 11/2001 |
| JP | 2002350833 | 12/2002 |
| JP | 2003173872 A | 6/2003 |
| JP | 2003282235 | 10/2003 |
| JP | 2003317953 | 11/2003 |
| JP | 2004-170910 | 6/2004 |
| JP | 2004-205601 | 7/2004 |
| JP | 2005071693 | 3/2005 |
| JP | 2005085705 | 3/2005 |
| JP | 2005-183414 | 7/2005 |
| JP | 2005-222789 | 8/2005 |
| JP | 2005-222930 | 8/2005 |
| JP | 2005284252 | 10/2005 |
| JP | 2005-340011 A | 12/2005 |
| JP | 2005-340182 | 12/2005 |
| JP | 2005340168 | 12/2005 |
| JP | 2006-058814 A | 3/2006 |
| JP | 2006-270511 A | 10/2006 |
| JP | 2007122984 A | 5/2007 |
| JP | 2008141151 | 6/2008 |
| KR | 1020030009913 A | 2/2003 |
| KR | 1020030054777 A | 7/2003 |
| KR | 1020030069434 A | 8/2003 |
| KR | 1020040010186 A | 1/2004 |
| KR | 1020040106808 | 12/2004 |
| KR | 1020050012958 A | 2/2005 |
| KR | 1020050029826 A | 3/2005 |
| KR | 10-2005-0064352 | 6/2005 |
| KR | 1020050051646 A | 6/2005 |
| KR | 1020050059259 A | 6/2005 |
| KR | 1020060089638 A | 8/2006 |
| KR | 1020060099743 | 9/2006 |
| KR | 10-2007-0014494 | 2/2007 |
| KR | 10-2007-0047633 | 5/2007 |
| WO | WO2004/075607 | 9/2004 |
| WO | 2005/093700 A2 | 10/2005 |

OTHER PUBLICATIONS

European Extended Search Report issued on Nov. 2, 2010 in the corresponding European Application No. 07252164.4.

Japanese Office Action issued on Jul. 2, 2013 in the corresponding Japanese Patent Application No. 2011-123294 of the cross-referenced U.S. Appl. No. 11/785,099.

* cited by examiner

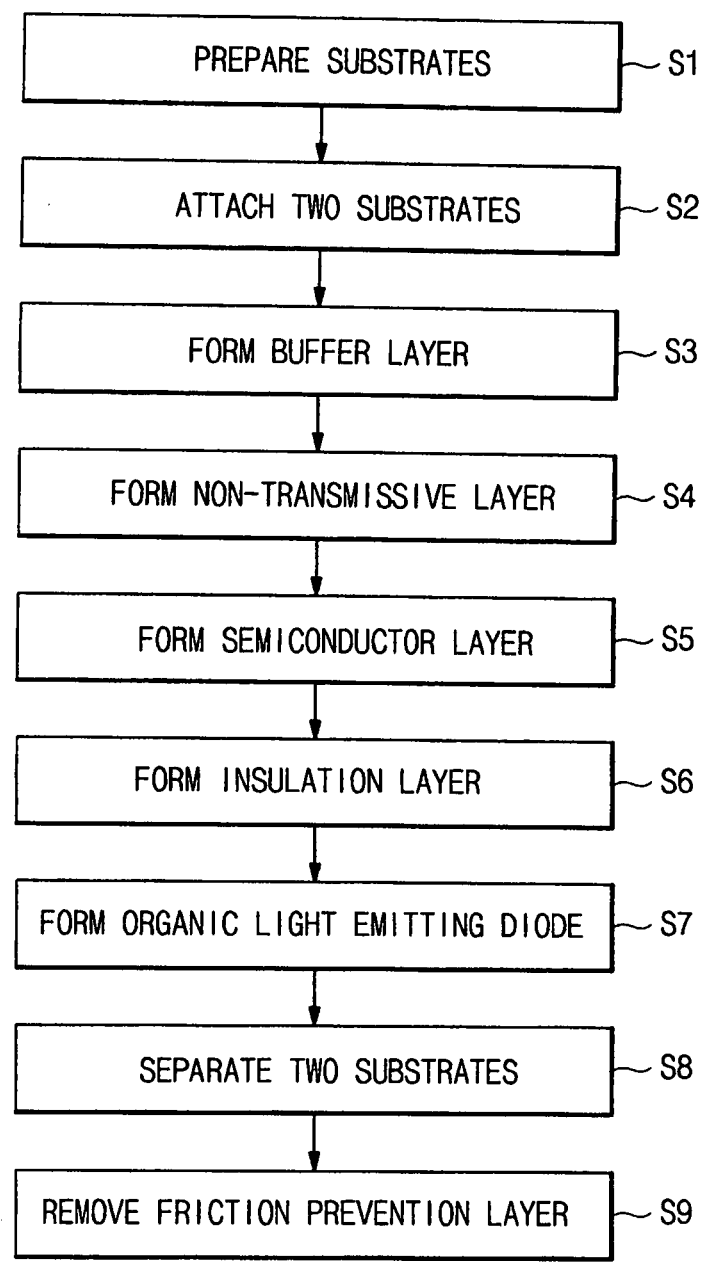

FIG.4i
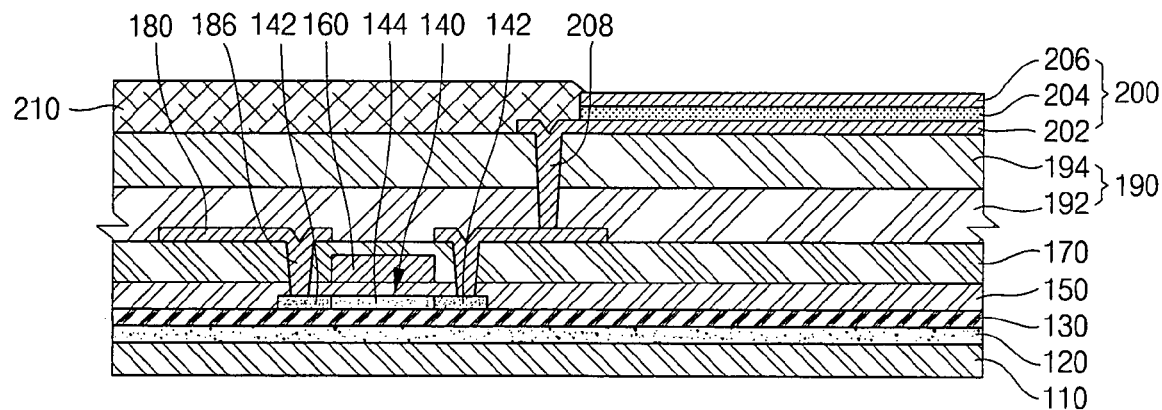
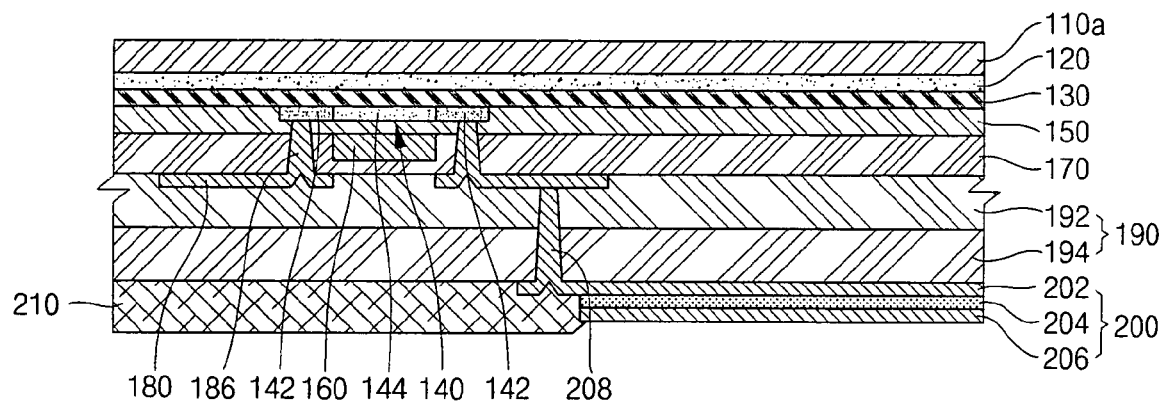

US 8,598,780 B2

ORGANIC LIGHT EMITTING DISPLAY AND FABRICATION METHOD THEREOF

CLAIM OF PRIORITY

This application makes reference to, incorporates the same herein, and claims all benefits accruing under 35 U.S.C. §119 from an application for ORGANIC LIGHT EMITTING DISPLAY DEVICE AND MANUFACTURING METHOD THEREOF AND MOVING DEVICE THEREFOR earlier filed in the Korean Intellectual Property Office on 10 Nov. 2006 and there duly assigned Serial No. 10-2006-0111300.

BACKGROUND OF THE INVENTION

1. Field of the Invention

The present invention relates to an organic light emitting display and a fabrication method thereof, and in particularly, relates to an organic light emitting display and a fabrication method thereof, in which an organic light emitting display has a small thickness, an organic light emitting layer and semiconductor layers are protected from UV-ray during or after fabrication processes of the organic light emitting diode, damages of the substrate of the organic light emitting diode during the fabrication processes are prevented, and the fabrication process time may be reduced.

2. Description of the Related Art

Generally, an organic light emitting display is a self-emitting device that emits light when electrical current activates fluorescence or phosphorescence organic layer. The organic light emitting display can display images by driving multiple light emitting diodes, which are formed in the organic light emitting display, with voltage or electrical current.

An organic light emitting display (OLED) is widely used as a display information device, because of the advantages of a wide angle viewing, fast response time, and self-emission. The organic light emitting display has a light weight and a low power consumption, and a backlight is not required. The organic light emitting display can be manufactured in low temperature, and the fabrication processes are relatively simple. Therefore, cost for manufacturing the OLED device is reduced. Material technology and process technology for the OLED are rapidly being developed, and the OLED is recognized as a device which can replace contemporary flat panel display devices.

As mobile phones, PDAs, lap top computers, monitors, televisions, etc. requires sliminess, a demand for organic light emitting displays having the thickness smaller than 1 mm has increased. In order to satisfy the demand for sliminess, improved manufacturing process is required. A protection film technology, which can replace the contemporary sealing technology, however, is not yet completely developed, and thus it is difficult to fabricate an OLED having the thickness small than 1 mm.

Regarding fabrication of an organic light emitting display having the thickness small than 1 mm, Japanese Patent Publication No. 2005-340182, Japanese Patent Publication No. 2005-222930, and Japanese Patent Publication No. 2005-222789 describe methods for fabricating a slim organic light emitting display by using processes for forming layers (a semiconductor layer and an organic light emitting diodes display) on each of two glass substrates, laminating two glass substrates together so that layers may face each other, and eliminating the surface having no layers by an etching or grinding process.

In these methods described above, however, there exists a problem that the process time for the fabrication becomes extremely long, because an etching or grinding process has to follow the process for forming a semiconductor layer or an organic light emitting diode, and the process for laminating the substrates. Moreover, there is high possibility that a glass substrate, a semiconductor layer, and an organic light emitting diode can be damaged or destroyed during the lamination process, and thus there are problems that the production yield is low and the fabrication cost becomes high.

Processes for forming a semiconductor layer on a glass substrate having the thickness small than 1 mm can be considered to make the thin organic light emitting display. In this case, however, the glass substrate is so thin that the glass substrate is easily bent during transportation of the substrate from one process to the other process, or is easily damaged when the substrate is mechanically shocked during the transportation.

SUMMARY OF THE INVENTION

The present invention is provided to solve the above mentioned problems, and the object of the present invention is to provide an organic light emitting display having a small thickness, and to provide a fabrication method thereof.

Another object of the present invention is to provide an organic light emitting display and a fabrication method thereof, in which a semiconductor and an organic light emitting diode are protected from a UV-ray during or after fabrication processes.

Another object of the present invention is to provide a fabrication method of an organic light emitting display that prevents bending and damages of a substrate of the organic light emitting display during the fabricating processes.

Another object of the present invention is to reduce process time for fabrication of an organic light emitting display, and thereby to improve productivity and to reduce cost for fabrication of an organic light emitting display.

In order to accomplish the above-mentioned objects, an organic light emitting display of the present invention includes a substrate, an organic light emitting diode for generating light, a semiconductor layer disposed between an upper surface of the substrate and the organic light emitting diode, an insulation layer disposed between the semiconductor layer and the organic light emitting diode, and a non-transmissive layer disposed between the substrate and the semiconductor layer. The non-transmissive layer blocks a UV-ray. The organic light emitting display of the present invention further includes a gate insulation layer disposed between the semiconductor layer and the insulation layer, a gate electrode disposed between the gate insulation layer and the insulation layer, an inter-layer dielectric layer disposed between the gate electrode and the insulation layer, and a source/drain electrode disposed between the inter-layer dielectric layer and the insulation layer.

The non-transmissive layer can include a protective agent for blocking a UV-ray. The non-transmissive layer can include a metal that blocks a UV-ray, a transparent protective agent that blocks a UV-ray, or an opaque protective agent that blocks a UV-ray. The non-transmissive layer can include chromium (Cr), chromium oxide ($Cr_2O_3$), aluminum (Al), gold (Au), silver (Ag), magnesium oxide (MgO), or silver alloy. The non-transmissive layer may have a thickness between about 500 Angstrom (Å) and about 3,000 Angstrom (Å).

The substrate can have a thickness between about 0.05 mm and about 1 mm. The substrate can be made of a material such as glass, plastic, polymer, and steel.

The organic light emitting display of the present invention may further include a buffer layer formed between the non-transmissive layer and the semiconductor layer or between the non-transmissive layer and the substrate.

The organic light emitting display of the present invention may further include a friction prevention layer formed on a lower surface of the substrate. The friction prevention layer may have a thickness between about 10 micro-meters and about 100 micro-meters. The friction prevention layer may include an organic material or an inorganic material.

In order to accomplish the above-mentioned objects, a method for fabricating an organic light emitting display of the present invention includes steps of providing a first substrate, providing a second substrate, attaching a lower surface of the first substrate to an upper surface of the second substrate, forming a non-transmissive layer on both of an upper surface of the first substrate and a lower surface of the second substrate, forming a semiconductor layer on the non-transmissive layer, forming an insulation layer on the semiconductor layer, forming an organic light emitting diode on the insulation layer, and separating the first substrate from the second substrate.

The method for fabricating an organic light emitting display of the present invention can further includes a step of forming a buffer layer on both of the upper surface of the first substrate and the lower surface of the second substrate before the step for forming an non-transmissive layer. The method for fabricating an organic light emitting display of the present invention can further includes a step of forming a buffer layer on the non-transmissive layer before the step for forming a semiconductor layer.

The method for fabricating an organic light emitting display of the present invention can further includes a step of forming a friction prevention layer either on the lower surface of the first substrate or on the upper surface of the second substrate before the step for attaching a lower surface of the first substrate to an upper surface of the second substrate.

The method for fabricating an organic light emitting display of the present invention can further includes a step of removing the friction prevention layer after the step of separating the first substrate from the second substrate.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein:

FIG. 3 shows a flow chart for a method of fabricating an organic light emitting display of the present invention; and FIG. 4a through FIG. 4i illustrate cross-sectional views at steps of fabricating an organic light emitting display of the present invention.

DETAILED DESCRIPTION OF THE INVENTION

The preferred embodiment of the present invention will be explained in detail with referring to the attached drawings so that the present invention can be derived by the person having ordinary skills in the field to which the present invention belongs.

Figure 1:
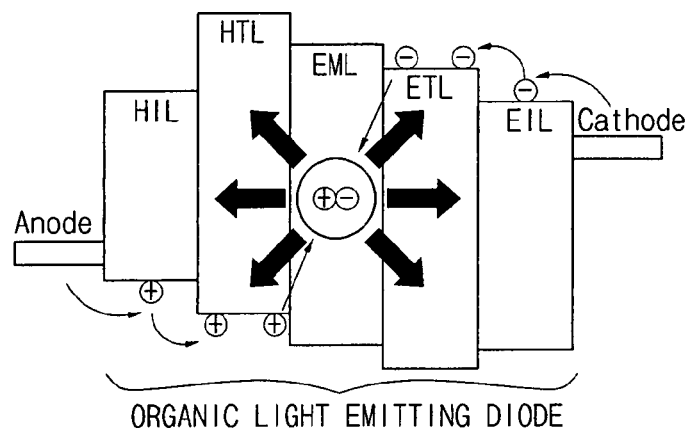
FIG. 1 illustrates a schematic diagram of an organic light emitting diode.

FIG. 1 shows a schematic diagram of an organic light emitting diode. As illustrated in FIG. 1, an organic light emitting diode includes an anode, a cathode, and an organic layer disposed between the anode and the cathode. The organic layer can include an emission layer (EML) which emits light when electrons and holes are recombined and thereby an exciton is formed, an electron transport layer (ETL) that transports electrons, and a hole transport layer (HTL) that transports holes. Furthermore, in the electron transport layer (ETL), an electron injection layer (EIL) for improving effectiveness of the electron injection can be further formed. In the hole transport layer, a hole injection layer (HIL) for improving effectiveness of the injection of holes can be further formed.

Figure 2A:
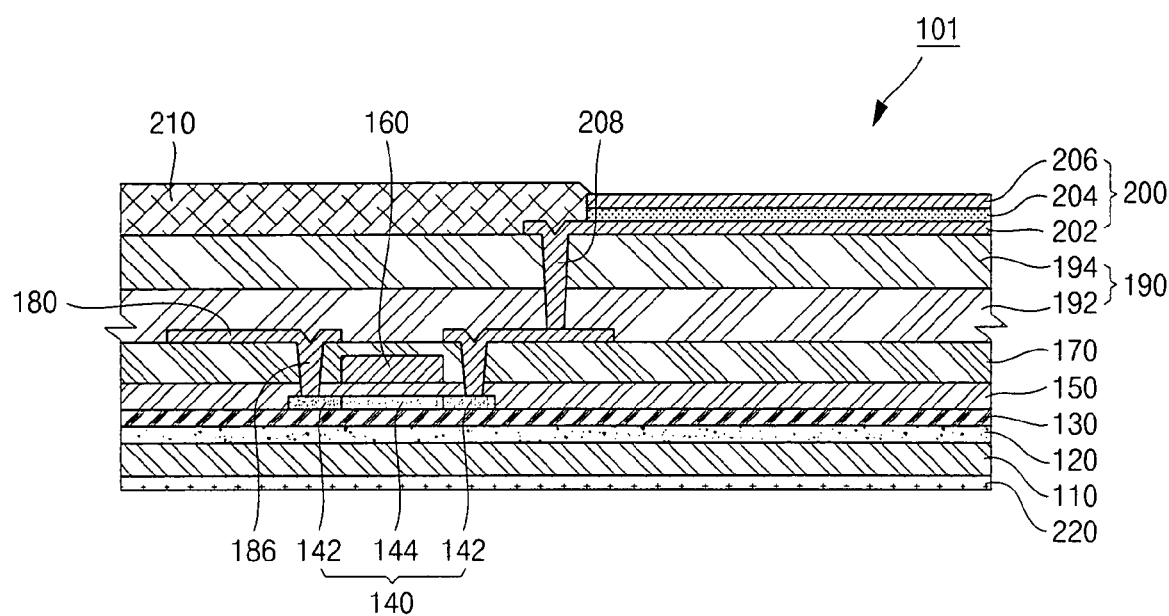
FIG. 2a illustrates a cross sectional view of an organic light emitting display constructed as one embodiment of the present invention.
Figure 2B:
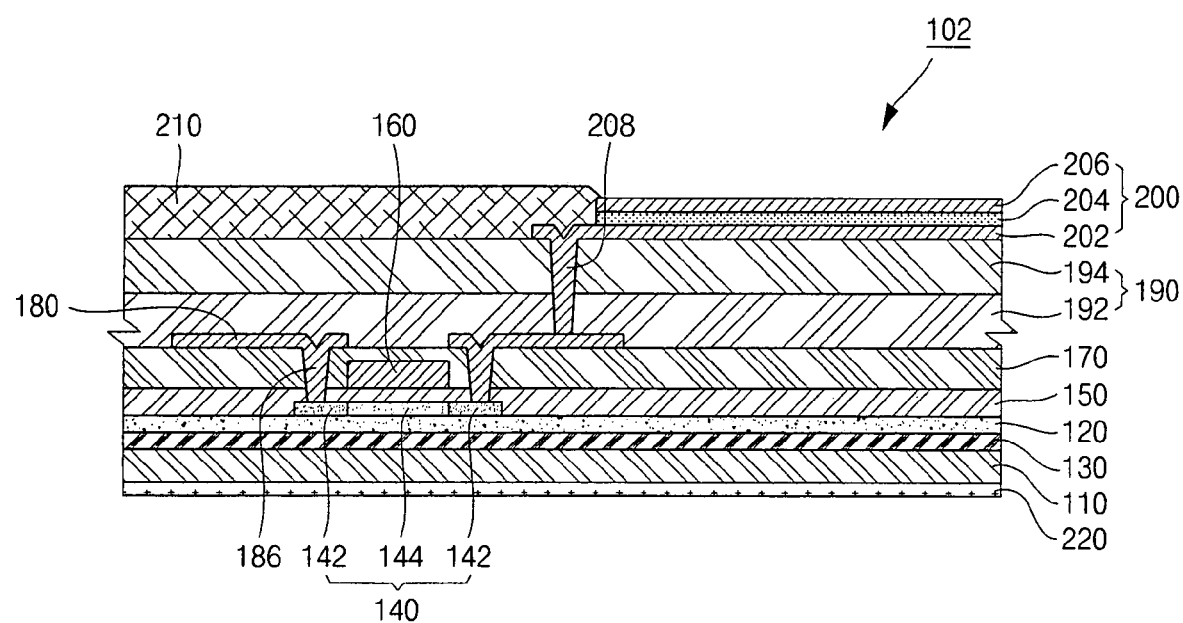
FIG. 2b illustrates a cross sectional view of an organic light emitting display constructed as another embodiment of the present invention.

FIG. 2a and FIG. 2b show cross sections of organic light emitting displays 101 and 102 constructed as embodiments of the present invention.

As illustrated in FIG. 2a, organic light emitting display 101 of the present invention includes substrate (or first substrate) 110, buffer layer 120 formed on substrate 110, non-transmissive layer 130 formed on buffer layer 120, semiconductor layer 140 formed on non-transmissive layer 130, gate insulation layer 150 formed on semiconductor layer 140, gate electrode 160 formed on gate insulation layer 150, inter-layer dielectric layer 170 formed on gate electrode 160, source/drain electrode 180 formed on inter-layer dielectric layer 170, insulation layer 190 formed on source/drain electrode 180, organic light emitting diode 200 formed on insulation layer 190, pixel definition layer 210 formed on insulation layer 190, and friction prevention layer 220 formed in the lower surface of substrate 110. Pixel definition layer 210 is formed on an external periphery of organic light emitting diodes 200.

The upper surface and the lower surface of substrate 110 are substantially flat and the thickness of substrate 110 (distance between the upper surface and the lower surface of substrate 110) can be about 0.05 mm to 1.0 mm. If the thickness of substrate 110 is small than about 0.05 mm, substrate 110 can be damaged during washing (or cleaning), etching, or heating process of the fabrication process of organic light emitting display. There is shortcomings that substrate 110 can be fragile and can be damaged by external force. If the thickness of substrate 110 is greater than about 1 mm, it is difficult to use substrate 110 for devices, which are required to be slim.

Substrate 110 can be formed by a material such as glass, plastic, polymer, steel, or the equivalents thereof, but the present invention is not limited to these materials.

Buffer layer 120 can be formed on upper surface of substrate 110. Buffer layer 120 prevents moisture ($H_2O$), hydrogen ($H_2$), oxygen ($O_2$) and etc. from permeating into semiconductor layer 140 or organic light emitting diodes 200 via substrate 110. For this purpose, buffer layer 120 can be formed by a material such as silicon oxidation film ($SiO_2$), silicon nitration film ($Si_3N_4$), inorganic film, or the equivalents thereof, but the present invention is not limited to these materials.

Non-transmissive layer 130 can be formed on upper surface of buffer layer 120. Non-transmissive layer 130 prevents a UV-ray from transmitting into an opposite surface of substrate 110 during a fabrication process for forming semiconductor layer 140 and organic light emitting diode 200. Non-transmissive layer 130 also prevents an external UV-ray from transmitting into semiconductor layer 140 or organic light emitting diodes 200 after the fabrication process. Non-transmissive layer 130 can be formed by a material such as UV light protective agent or the equivalents thereof. In addition, non-transmissive layer 130 can be formed of a material such as insulation metal, transparent UV-ray protective agent, opaque UV-ray protective agent, or the equivalents thereof. If non-transmissive layer 130 is a metal layer, it can be formed of a metal such as chromium (Cr), chromium oxide ($Cr_2O_3$), aluminum (Al), gold (Au), silver (Ag), magnesium oxide (MgO), silver alloy, or the equivalents thereof, but the present invention is not limited to these materials. in this case, a special insulation process also can be processed on the surface so that a trouble, such as electrical short between non-transmissive layer 130 and semiconductor layer 140, can be prevented. If the material has an insulating property, the insulation process may not be necessary.

It is preferable that non-transmissive layer 130 has a thickness of 500 Å to 3,000 Å. If the thickness of non-transmissive layer 130 is small than 500 Å, a UV-ray can penetrates into semiconductor layer 140 or organic light emitting diodes display 200 during or after the fabrication processes, because the blocking rate of the UV-ray is very low. If the thickness of non-transmissive layer 130 is greater than 3,000 Å, even though a UV-ray can be sufficiently blocked, it is not preferable, because the thickness of non-transmissive layer 130 could increase overall thickness of organic light emitting display.

Semiconductor layer 140 can be formed on the upper surface of non-transmissive layer 130. Semiconductor layer 140 may include a pair of source/drain regions 142 and channel region 144 formed between source/drain regions 142. For example, semiconductor layer 140 can be a thin-film transistor. The thin-film transistor can be a transistor such as an amorphous silicon thin-film transistor, a poly-silicon thin-film transistor, an organic layer transistor, a micro silicon (a silicon having the size of a grain between the amorphous silicon and the poly-silicon) thin-film transistor, or the equivalents thereof, but the present invention does not limit the types of the thin-film transistors.

If the thin-film transistor is a poly-silicon thin-film transistor, the poly-silicon thin-film transistor can be formed by a method such as a crystallization method that uses a laser beam and conducted at low temperature, a crystallization method using a metal, a crystallization method that is conducted at high pressure, or the equivalent methods, but the present invention does not limit the crystallization method of the ploy-silicon. The crystallization method using a laser can employ excimer laser annealing (ELA), sequential lateral solidification (SLS), thin beam direction crystallization (TDX), etc., but the present invention is not limited in these methods. The crystallization method using a metal can employ solid phases crystallization (SPC), metal induced crystallization (MIC), metal induced lateral crystallization (MILC), super grained silicon (SGS), etc., but the present invention is not limited in these methods. The thin-film transistor can be p-channel metal oxide semiconductor (PMOS), n-channel metal oxide semiconductor (NMOS), or the equivalents thereof, but the present invention is not limited in the conductive types of the thin-film transistor.

Gate insulation layer 150 can be formed on upper surface of semiconductor layer 140. In a region outside the periphery of semiconductor layer 140, gate insulation layer 150 can be formed on non-transmissive layer 130. Gate insulation layer 150 can be a silicon oxidation film, a silicon nitration film, an inorganic film, or the equivalents thereof which can be obtained during the semiconductor processes, but the present invention is not limited to these materials.

Gate electrode 160 can be formed on the upper surface of gate insulation layer 150. More specifically, gate electrode 160 is formed on gate insulation layer 150 on the top of channel region 144 of semiconductor layer 140. Because an electric field is formed in channel region 144 of semiconductor layer 140 through gate electrode 160 and gate insulation layer 150, a hole or an electron channel is formed in the channel region 134. Gate electrode 160 can be formed of a material such as molybdenum (Mo), tungsten molybdenum (MoW), titanium (Ti), copper (Cu), aluminum (Al), aluminum neodymium (AlNd), chromium (Cr), molybdenum alloy, copper alloy, aluminum alloy, etc., but the present invention is not limited in these materials.

Inter-layer dielectric layer 170 can be formed on the upper surface of gate electrode 160. Inter-layer dielectric layer 170 is formed on gate insulation layer 150 in a region outside the periphery of gate electrode 160. Inter-layer dielectric layer 170 can be formed of a material such as a polymer material, a plastic material, a glass material, or the equivalent materials, but the present invention does not limit the materials of inter-layer dielectric layer 170.

Source/drain electrode 180 can be formed on the upper surface of inter-layer dielectric layer 170. Conductive contact 186 (electrically conductive contact) penetrating through inter-layer dielectric layer 170 can be formed between source/drain electrode 180 and semiconductor layer 140. Source/drain region 142 and source/drain electrode 180 of semiconductor layer 140 are electrically connected trough conductive contact 186. Source/drain electrode 180 can be formed of a metal material same as the material of gate electrode 160. The material for source/drain electrode 180, however, is not limited in these materials.

Semiconductor layer 140, which can be a thin-film transistor, can have a coplanar structure. However, semiconductor layer 140 illustrated in the present invention is not limited to the coplanar structure, and it can be formed as any type of structures of thin film transistors which have already been known in the art, such as an inverted coplanar structure, a staggered structure, an inverted staggered structure, or the equivalent structures. The present invention, however, is not limited in these structures.

Insulation layer 190 can be formed on the upper surface of source/drain electrode 180. Insulation layer 190 can include protection film 192 and flattening film 194 formed on the upper surface of protection film 192. Protection film 192 covers source/drain electrode 180 and inter-layer dielectric layer 170, and protects source/drain electrode 180 and inter-layer dielectric layer 170. Protection film 192 can be formed of a common inorganic film or the equivalents thereof, but the present invention does not limit the materials of protection film 192. In addition, flattening film 194 flattens the surface. Flattening film 194 can be formed of a material such as benzo cyclo butene (BCB), acryl, or the equivalents thereof. The present invention, however, does not limit the materials of flattening film 194.

Organic light emitting diode 200 can be formed on the upper surface of insulation layer 190. Organic light emitting diode 200 may include anode 202, organic light emitting diode thin film 204 formed on the upper surface of anode 202, and cathode 206 formed on the upper surface of organic light emitting diode thin film 204. Anode 202 can be formed of a material such as induim tin oxide (ITO), induim tin oxide/silver (ITO/Ag), induim tin oxide/silver/induim tin oxide (ITO/Ag/ITO), induim tin oxide/silver/indium zinc oxide (ITO/Ag/IZO), or equivalents thereof. The present invention, however, does not limit the materials of anode 202. The ITO has an uniform work function, and is a transparent conductive film in which a hole injection barrier for organic light emitting diodes thin film 204 is small, and the silver (Ag) is a film which reflects light emitted from organic light emitting diode thin film 204 toward the upper direction in a front light-emitting diodes type display.

Organic light emitting diode thin film 204 can include an emitting diodes layer (EML) in which a hole and an electron are combined and then an exciton is formed to emit a light, an electron transport layer (ETL) for controlling moving speed of electrons, and a hole transport layer (HTL) for controlling moving speed of holes. An electron injection layer (EIL) for improving effectiveness of electron injection can be further formed in the electron transport layer, and a hole injection layer (HIL) for improving effectiveness of hole injection can be further formed in the hole transport layer. Cathode 206 can be made of aluminum (Al), magnesium-silver (MgAg) alloy, magnesium-calcium (MgCa) alloy, or the equivalents thereof. The present invention, however, does not limit the materials of cathode 206.

If the front light-emitting diode type display is employed in the present invention, the aluminum (Al) layer should be thin. In this case, because the resistance of aluminum layer becomes high, the electron injection barrier becomes large. The electron injection barrier of the MgAg alloy is smaller than the electron injection barrier of Al, and the electron injection barrier of the MgCa alloy is much smaller than the electron injection barrier of the MgAg alloy. The MgAg alloy and MgCa alloy, however, are very susceptible to ambient condition, and can form an insulation layer through an oxidation reaction. Therefore, it is necessary to prevent the MgAg alloy or MgCa alloy from being exposed to ambient condition. In addition, anode 202 and source/drain electrode 180 of organic light emitting diode 200 are electrically connected through electrically conductive via 208 penetrating through insulation layer 190 (protection film 192 and flattening film 194).

In the above description, a front light-emitting diode type display, which radiates light through the upper surface of organic light emitting display 101, is explained as an example. The present invention, however, is not limited to this type of display. The principles of the present invention can be applied to a rear light-emitting diode type display, which radiates light through the lower surface of organic light emitting display 101, or a front and rear light-emitting diode type display, which radiates light through both of the upper and lower surface of organic light emitting display 101.

Pixel definition layer 210 is formed on insulation layer 190 in a region outside a periphery of organic light emitting diode 200. If there are a plurality of organic light emitting diodes, pixel definition layer 210 separates the organic light emitting diodes from each other. For example, pixel definition layer 210 clearly defines areas of red organic light emitting diodes, green organic light emitting diodes, and blue organic light emitting diodes. Pixel definition layer 210 can be formed of a material such as polyimide or the equivalents thereof, but the material of pixel definition layer 210 is not limited.

Organic light emitting display 101 of the present invention can further include friction prevention layer 220 on the lower surface of substrate 110. During the fabrication process of the organic light emitting display of the present invention, two substrates can be laminated together. In this case, friction prevention layer 220 keeps two substrates being attached together, and also prevents two substrates from contacting each other during a process for forming semiconductor layer 140, organic light emitting diode 200, etc. Two substrates 110 laminated together through friction prevention layer 220 maintains predetermined hardness by increasing an entire thickness, and therefore bending or damage can be prevented while the laminated substrates are transported between processes. Friction prevention layer 220 can be formed of a material such as an organic material, an inorganic material, or the equivalents thereof, but the material of friction prevention layer 220 is not limited to these materials. It is preferable that friction prevention layer 220 has a thickness of 10 μm-100 μm. If the thickness of friction prevention layer 220 is small than 10 μm, two substrates can contact each other during the fabrication processes. If the thickness of friction prevention layer 220 is greater than 100 μm, the entire thickness of the laminated substrates can be too thick for the fabrication processes.

FIG. 2b shows another embodiment of an organic light emitting display of the present invention. As illustrated in FIG. 2b, in organic light emitting display 102 of the present invention, non-transmissive layer 130 can be formed between substrate 110 and buffer layer 120. The material and the thickness of non-transmissive layer 130 of organic light emitting display 102 are the same as the material and the thickness of non-transmissive layer 130 of organic light emitting display 101. Because non-transmissive layer 130 is not formed on the upper surface of buffer layer 120, but is formed between substrate 110 and buffer layer 120, troubles such as electrical short between non-transmissive layer 130 and semiconductor layer 140 can be prevented.

FIG. 3 illustrates steps for fabricating the organic light emitting display of the present invention. As illustrated in FIG. 3, fabrication method of the organic light emitting display of the present invention can include step S1 for providing substrates, step S2 for attaching two prepared substrates, step S3 for forming a buffer layer, step S4 for forming a non-transmissive layer, step S5 for forming a semiconductor layer, step S6 for forming an insulation layer, step S7 for forming an organic light emitting diode, step S8 for separating two substrates, and step S9 for removing a friction prevention layer.

FIGS. 4a through 4i shows cross-sectional views to illustrate steps for fabrication of an organic light emitting display of the present invention. Referring to FIG. 3 and FIGS. 4a through 4i, a fabrication method of the organic light emitting display of the present invention will be explained in detail.

Figure 4A:

First of all, as illustrated in FIG. 4a, which corresponds to step S1 of FIG. 3, first substrate 110 and second substrate 110a, which has a flat upper and lower surfaces and have predetermined thicknesses, are prepared. First substrate 110 can be referred to as substrate 110, and second substrate 110a can be referred to as encapsulation substrate 110a. Each of first substrate 110 and second substrate 110a can be made of a material such as common glass, plastic, polymer, steel, or the equivalents thereof, but the present invention does not limit the materials and the kinds of first substrate 110 and second substrate 110a. It is preferable that each of first substrate 110 and second substrate 110a has a thickness of approximately 0.05 mm to 1 mm. If the thickness of substrate 110 or 110a is small than about 0.05 mm, there are problems that substrate 110 or 110a can be easily damaged during a washing, etching, or heat process in the fabrication process. In addition, substrate 110 or 110a becomes difficult to handle, and can be easily destroyed when external force is applied to substrate 110 or 110a. If thickness of substrate 110 or 110a is greater than about 1 mm, there is a problem that substrate 110 or 110a is difficult to be used in various types of display devices, which requires sliminess.

Figure 4B:
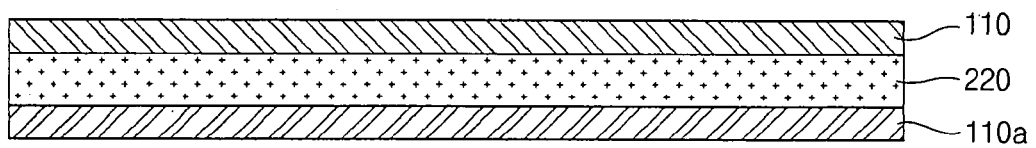

As illustrated in FIG. 4b, which corresponds to step S2 of FIG. 3, first substrates 110 and second substrate 110a, of which are prepared according the process described referring to FIG. 4a, are attached together. In order to prevent the direct contact between first substrate 110 and second substrate 110a, and in order to maintain a constant hardness during fabrication processes, friction prevention layer 220 can be disposed between first substrate 110 and second substrate 110a. Friction prevention layer 220 can be formed by depositing or applying a material such as organic material, inorganic material, or the equivalents thereof, but the present invention does not limit the materials or the formation methods of friction prevention layer 220. Because friction prevention layer 220 is to be eliminated after fabrication of an organic light emitting display, a material that can be easily eliminated is preferred. For example, an organic material such as photo resist can be used for material of friction prevention layer 220, but the material of friction prevention layer 220 is not limited. An adhesive (not shown) can be further applied at edges or the entire surface of substrate 110 or 110a during the fabrication processes so that first substrate 110 and second substrate 110a may not be separated. A material such as common epoxy adhesive, UV-ray curing adhesive, or the equivalents thereof can be used for the adhesive, but the materials of the adhesive are not limited. Friction prevention layer 220 can be formed in advance on each of first substrate 110 and second substrate 110a, and then first substrate 110 and second substrate 110a can be attached together. It is also possible to first prepare adhesive-coated substrates, to attach the substrates together, and then to inject friction prevention layer 220, which is in a form of liquid, into the space created between two substrates. If liquid friction prevention layer 220 is injected into the space created between first substrate 110 and second substrate 110a, the injection process can be easily carried out due to capillary phenomenon. After liquid friction prevention layer 220 is injected, it is preferable that liquid friction prevention layer 220 is cured at predetermined temperature to solidify friction prevention layer 220.

Figure 4C:
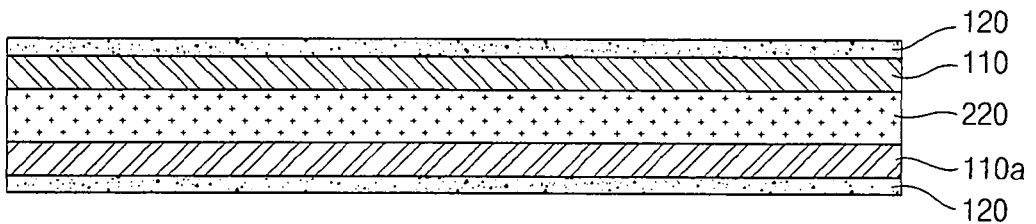

As illustrated in FIG. 4c, which corresponds to step S3 of FIG. 3, buffer layer 120 having a constant thickness is formed on a surface of each of first substrate 110 and second substrate 110a. Buffer layer 120 can be a layer such as a silicon oxidation film, a silicon nitration film, an inorganic film or the equivalents thereof. Buffer layer 120 prevents moisture, hydrogen, oxygen, etc. from being transferred to semiconductor layer 140 or organic light emitting diode 200 via substrates 110 and 110a. Buffer layer 120 enables non-transmissive layer 130 or semiconductor layer 140 to be formed smoothly and uniformly. Buffer layer 120 can be first formed on one of substrates 110 and 110a, and then can be formed on the other substrate sequentially, or can be formed on both substrates simultaneously.

Figure 4D:
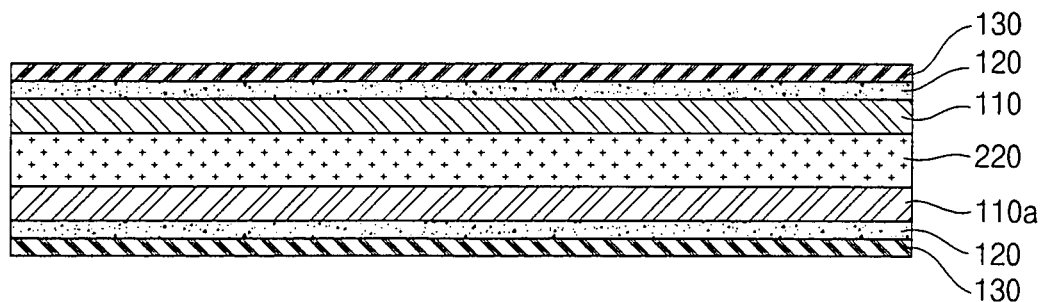

As illustrated in FIG. 4d, which corresponds to step S4 of FIG. 3, non-transmissive layer 130 having a constant thickness is formed on the surface of buffer layer 120. Non-transmissive layer 130 reflects light to prevent a UV-ray from transmitting into other opposing substrate 110 or 110a during a process for forming semiconductor layer 140 and organic light emitting diodes 200. Non-transmissive layer 130 also reflects light to prevent an external UV-ray from transmitting into semiconductor layer 140 or organic light emitting diodes 200 after first substrate 110 and second substrate 110a are separated. Non-transmissive layer 130 can be substantially formed of a material such as a protective agent for blocking a UV-ray, and the equivalents thereof. If non-transmissive layer 130 is formed by a metal, non-transmissive layer 130 can be made of a metal such as chromium (Cr), chromium oxide ($Cr_2O_3$), aluminum (Al), gold (Au), silver (Ag), magnesium oxide (MgO), silver alloy, or the equivalents thereof, but the materials of non-transmissive layer 130 are not limited. It is preferable that the problem of electrical short is prevented between non-transmissive layer 130 and semiconductor layer 140 through an insulation process of non-transmissive layer 130. Further, it is preferable that non-transmissive layer has a thickness of 500 Å-3,000 Å. If the thickness of non-transmissive layer is smaller than 500 Å, the blocking rate of the UV-ray is very low, and semiconductor layer 140 or organic light emitting diodes display 200 can be exposed to the UV-ray during or after the fabrication processes. If the thickness of non-transmissive layer 130 is greater than 3,000 Å, even if sufficient blocking of the UV-ray is effectively achieved, non-transmissive layer 130 can be too thick to be used in devices that requires sliminess.

On the other hand, non-transmissive layer 130 can be directly formed on the surface of first substrate 110 and second substrate 110a instead of being formed on the surface of buffer layer 120, as described referring to organic light emitting display 102 shown in FIG. 2b. First of all, non-transmissive layer 130 is formed on the surface of first substrate 110 and second substrate 110a, and subsequently, buffer layer 120 is formed on the surface of non-transmissive layer 130. In this way, if non-transmissive layer 130 is formed before buffer layer 120 is formed, the problem of electrical short, which may be generated between non-transmissive layer 130 and semiconductor layer 140, can be prevented.

Non-transmissive layer 130 can be formed by a method such as PECVD (Plasma Enhanced Chemical Vapor Deposition), LPCVD (Low Pressure Chemical Vapor Deposition), sputtering, coating, or the equivalents thereof, but the formation methods are not limited hereto. Non-transmissive layer 130 also can be formed by a method such as coating, or the equivalents thereof, but the formation methods are not limited hereto. Non-transmissive layer 130 can be first formed on one substrate, and then can be formed on the other substrate sequentially, or can be formed both of the substrates simultaneously.

Figure 4E:
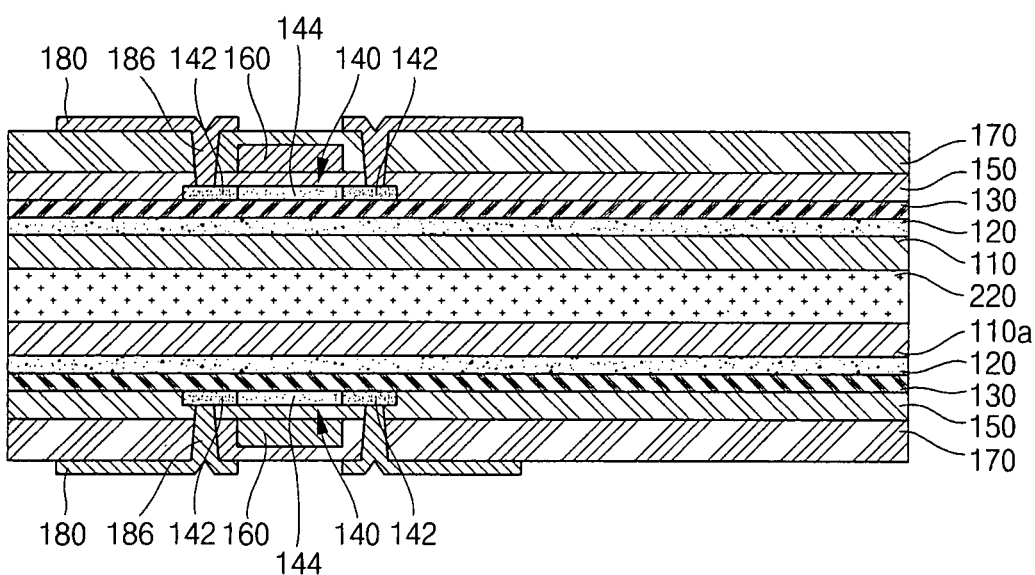

As illustrated in FIG. 4e, which corresponds to step S5 of FIG. 3, semiconductor layer 140 is formed on the surface of non-transmissive layer 130. Semiconductor layer 140 can include channel region 144 and source/drain regions 142 formed on two opposite sides of channel region 144. For example, semiconductor layer 140 can be a thin film transistor. A thin film transistor can be a transistor such as an amorphous silicon thin film transistor, a poly silicon thin film transistor, an organic layer transistor, a micro silicon thin film transistor, or the equivalents thereof, but the present invention does not limit the kinds of the thin film transistors.

If the thin film transistor is a poly silicon thin film transistor, it can be crystallized by a method such as a crystallization method using a laser at a low temperature, a crystallization method using a metal, a crystallization method using a high pressure, or the equivalent methods. Crystallization is conducted after forming amorphous silicon on non-transmissive layer 130 (or buffer layer 120), but the present invention does not limit the crystallization method of the ploy silicon. The amorphous silicon can be formed by a method such as PECVD, LPCVD, sputtering, or the equivalents thereof, but the method for forming the amorphous silicon is not limited here. After crystallization of the amorphous silicon, the desired number of the semiconductor layer 140 are formed at the desired positions through the processes such as a photoresist coating, exposure to lights, development, etching, and a photoresist removal.

On the other hand, excimer laser annealing (ELA)), sequential lateral solidification (SLS), or thin beam direction crystallization (TDC) can be used for the method for crystallizing the amorphous silicon into the poly-silicon by using a laser, but the present invention is not limited to these methods. Solid phases crystallization (SPC), metal induced crystallization (MIC), metal induced lateral crystallization (MILC), or super grained silicon (SGS) can be used for a crystallization method using the laser, but the present invention is not limited to these methods.

The thin film transistor can be any one of PMOS, NMOS, or the equivalents, but the present invention does not limit the conductive types of the thin film transistor.

Gate insulation layer 150 having a constant thickness is formed on the surface of semiconductor layer 140 by a method such as PECVD, LPCVD, sputtering, or the equivalents. Gate insulation layer 150 can also be formed on non-transmissive layer 130 on a region outside a periphery of semiconductor 140. Gate insulation layer 150 can be a layer such as a silicon oxidation film, a silicon nitration film, an inorganic film, or the equivalents thereof which can be easily obtained during the semiconductor processes, but the present invention is not limited to these materials.

Gate electrode 160 can be formed on the upper surface of gate insulation layer 150 by a method such as PECVD, LPCVD, sputtering, or the equivalents thereof. After the deposition process described above, the desired number of gate electrode 160 are formed at the desired positions through the processes such as a photoresist coating, exposure to lights, development, etching, and a photoresist removal. Gate electrode 160 can be formed on gate insulation layer 150 corresponding to channel region 144 of semiconductor layer 140. Since electric field is applied to channel region 144 through gate electrode 160, a hole or electron channel is formed on channel region 144. Gate electrode 160 can be formed of a material such as a common metal (molybdenum (Mo), tungsten molybdenum (MoW), titanium (Ti), copper (Cu), aluminum (Al), aluminum neodymium (AlNd), chromium (Cr), molybdenum alloy, copper alloy, aluminum alloy, etc.), the doped poly-silicon, or the equivalents thereof, but in the present invention is not limited to the materials.

Inter-layer dielectric layer 170 can be formed on the upper surface of gate electrode 160. Inter-layer dielectric layer 170 can also be formed on gate insulation layer 150 on a region outside a periphery of gate electrode 160. Inter-layer dielectric layer 170 can be formed of a material such as polymer, plastic, glass, or the equivalent systems, but the present invention is not limited to these materials. Source/drain region 142 is projected outside by etching the region corresponding to source/drain region 142 of inter-layer dielectric layer 170. The projected region is generally called a contact hole, and a conductive contact will be made on this contact hole.

Source/drain electrode 180 can be formed on the upper surface of inter-layer dielectric layer 170 by a method such as PECVD, LPCVD, or the equivalents thereof. After the deposition process described above, the desired number of source/drain electrode 180 are formed at the desired positions through the processes such as a photoresist coating, exposure to lights, development, etching, and a photoresist removal. Conductive contact 186 (electrically conductive contact) penetrating through inter-layer dielectric layer 170 can be formed between source/drain electrode 180 and source/drain region 142 of semiconductor layer 140. As illustrated above, conductive contact 186 is formed by filling the contact hole that has already been formed.

Source/drain electrode 180 and semiconductor layer 140 are electrically connected to each other by conductive contact 186. Conductive contact 186 can be formed by a material same as the material used for forming gate electrode 160 and source/drain electrode 180, and the present invention does not limit the materials of conductive contact 186. Source/drain electrode 180 can be formed by a metal material same as the metal material used for forming gate electrode 160, and the present invention does not limit the materials of source/drain electrode 180.

On the other hand, semiconductor layer 140 (that is, a thin film transistor) can be generally defined as a coplanar structure. However, semiconductor layer 140 illustrated in the present invention is not limited to the coplanar structure, and it can be formed as structures of all types of thin-film transistors which have already been known so far, for example, an inverted coplanar structure, a staggered structure, an inverted staggered structure, or the equivalent structures, and the present invention does not limit the structure of semiconductor layer 140.

Semiconductor layer 140 can be formed on one of substrates 110 and 110a, and then can be formed on the other substrate sequentially. That is, it is possible to form semiconductor layer 140 on one substrate, and then to form another semiconductor layer 140 on the other substrate once again. Semiconductor layer 140 can be formed sequentially by turning over the surfaces of the attached substrates In addition, if the process equipments are available, semiconductor layer 140 can be formed on both surfaces of the attached substrates simultaneously.

Figure 4F:
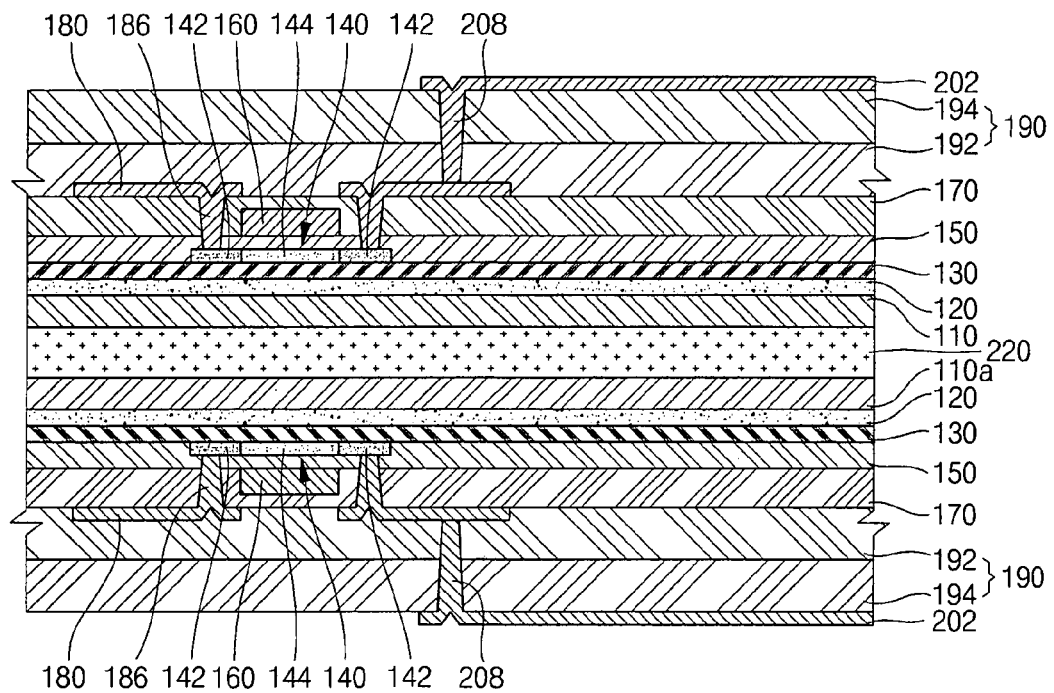

As illustrated in FIG. 4f, which corresponds to step S6 of FIG. 3, insulation layer 190 having a constant thickness is formed on the upper surface of semiconductor layer 140 (that is, the upper surface of source/drain electrode 180 and inter-layer dielectric layer 170).

The insulation layer 190 can include protection film 192 and flattening film 194. Protection layer 192 is first formed and then flattening layer 194 is formed on protection layer 192. The protection film 192 covers source/drain electrode 180 and inter-layer dielectric layer 170, and protects source/drain electrode 180 and inter-layer dielectric layer 170. A via hole is formed in advance in protection film 192 and flattening film 194 by etching the region corresponding to source/drain electrode 180. In the via hole, a conductive via will be formed later. Protection film 192 can be a common inorganic film, or the equivalents thereof, but the present invention does not limit the materials of protection film 192. Flattening film 194 is formed on protection film 192. Flattening film 194 flattens the entire surface, and can be formed by coating a material such as benzo cyclo butene (BCB), acryl, or the equivalents thereof, but the present invention does not limit the materials or the formation methods of flattening film 194.

Insulation layer 190 can be first formed on one of substrates 110 and 110a, and then can be formed on the other substrate sequentially. That is, it is possible to form insulation layer 190 on one substrate, and then to form another insulation layer 190 on the other substrate. Insulation layer 190 can be formed sequentially by turning over the surfaces of the attached substrates. In addition, if the process equipments are available, the insulation layer 190 can be formed on both surfaces of the attached substrates simultaneously.

Figure 4G:
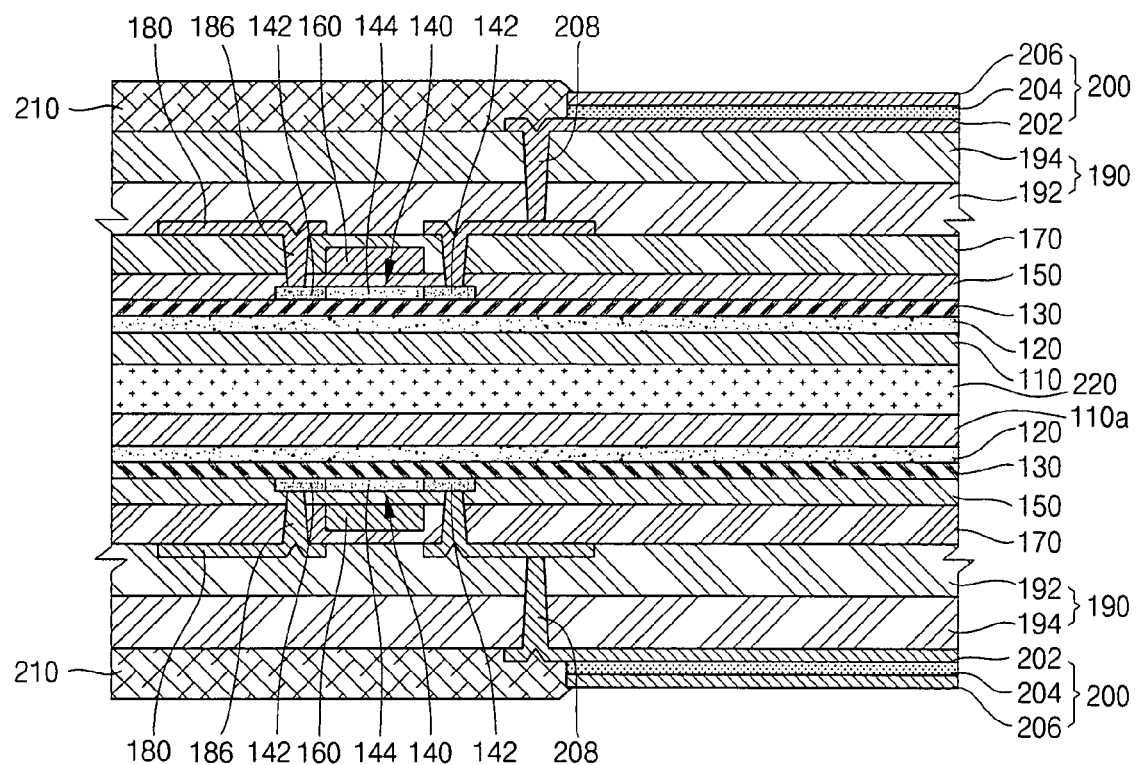

As illustrated in FIG. 4g, which corresponds to step S7 of FIG. 3, organic light emitting diode 200 is formed on the upper surface of insulation layer 190. Organic light emitting diode 200 includes anode 202, organic light emitting diode thin film 204 formed on the upper surface of anode 202, and cathode 206 formed on organic light emitting diode thin film 204.

Anode 202 can be formed of a material such as induim tin oxide (ITO), induim tin oxide/silver (ITO/Ag), induim tin oxide/silver/induim tin oxide (ITO/Ag/ITO), induim tin oxide/silver/indium zinc oxide (ITO/Ag/IZO), or the equivalents thereof, but the present invention does not limit the materials or the formation methods of anode 202. For example, anode 202 can be formed by any method such as RF sputtering, DC sputtering, an ion beam sputtering, or a vacuum deposition. Anode 202 having the desired area is formed at the desired positions through the processes such as a photoresist coating, exposure to lights, development, etching, and a photoresist removal. Anode 202 is electrically connected to source/drain electrode 180 through conductive via 208 penetrating through insulation layer 190.

Here, the ITO has a uniform work function, and is a transparent conductive film in which a hole injection barrier for organic light emitting diode thin film 204 is low, and the Ag reflects light emitted from organic light emitting diodes thin film 204 toward the upper surface in a front light-emitting diode type display.

Organic light emitting diodes thin film 204 can be formed by forming a hole injection layer (HIL) for improving effectiveness of the hole injections, a hole transport layer (HTL) for controlling the moving speed of the hole, an emitting diodes layer (EML) in which a hole and an electron are combined and then an exciton is formed to emit a light, an electron transport layer (ETL) for controlling the moving speed of electrons, and an electron injection layer (EIL) for improving effectiveness of the electron injections. The present invention, however, is not limited to these layers. For example, organic light emitting diodes thin film 204 can be formed by wet coating methods such as a spin coating using a material of a liquid state, a dip coating, a spray method, a screen printing method, an ink jet printing method, or so on, or can be formed by dry coating methods such as sputtering, a vacuum deposition, etc.

Cathode 206 is formed on the surface of electron injection layer of organic light emitting diodes thin film 204. Cathode 206 can be formed by deposition of a material such as aluminum (Al), magnesium-silver (MgAg) alloy, magnesium-calcium (MgCa) alloy, or the equivalents thereof, but the present invention is not limited to these materials or formation methods. For example, cathode 206 can be formed by a method such as RF sputtering, DC sputtering, an ion beam sputtering, or a vacuum deposition method. Cathode 206 having a desired area is formed at a desired position through the processes such as a photoresist coating, exposure to lights, development, etching, and photoresist removal.

If the front light-emitting diode type display is employed in the present invention, and aluminum is used for forming cathode 206, the aluminum cathode must be thin in order to increase light transmission, and in that case, as the resistance becomes higher, the electron injection barrier is getting higher. Therefore, at this time, a material such as magnesium-silver (MgAg) alloy, magnesium-calcium (MgCa) alloy, or the equivalents thereof having lower electron injection barrier than aluminum can be used for forming cathode 206. Cathode 206 can be formed of a material such as ITO or IZO.

Since MgAg alloy and MgCa alloy are very susceptible to the surrounding environments, and can form an insulation layer through an oxidation reaction, it is necessary to prevent MgAg alloy or MgCa alloy from being contacted to the ambient condition.

Pixel definition layer 210 is formed for defining the boundary clearly among the organic light emitting diode 200 after forming cathode 206. Pixel definition layer 210 can be formed by depositing a material such as polyimide or the equivalents thereof. After a coating or a deposition, organic light emitting diode 200 is exposed to outside through the processes such as a photoresist coating, exposure to lights, development, etching, and a photoresist removal.

The present invention explained the front light-emitting diode type display which radiates light toward the upper surface of organic light emitting display, but the present invention is not limited to this type display. The principles of the present invention can be applied to a rear light-emitting diode type display which radiates light toward the lower surface of organic light emitting display, or a front rear light-emitting diode type display which radiates light toward both of the lower surface and the upper surface of organic light emitting display.

Organic light emitting diode 200 can be formed on one of substrates 110 and 110a, and then can be formed on the other substrate sequentially. That is, it is possible to form organic light emitting diode 200 on one substrate, and then to form another organic light emitting diode 200 on the other substrate. Organic light emitting diodes 200 can be formed sequentially by turning over one side substrate and the other side substrate. In addition, if the process equipments are available, organic light emitting diodes 200 can be formed on both substrates simultaneously.

Figure 4H:
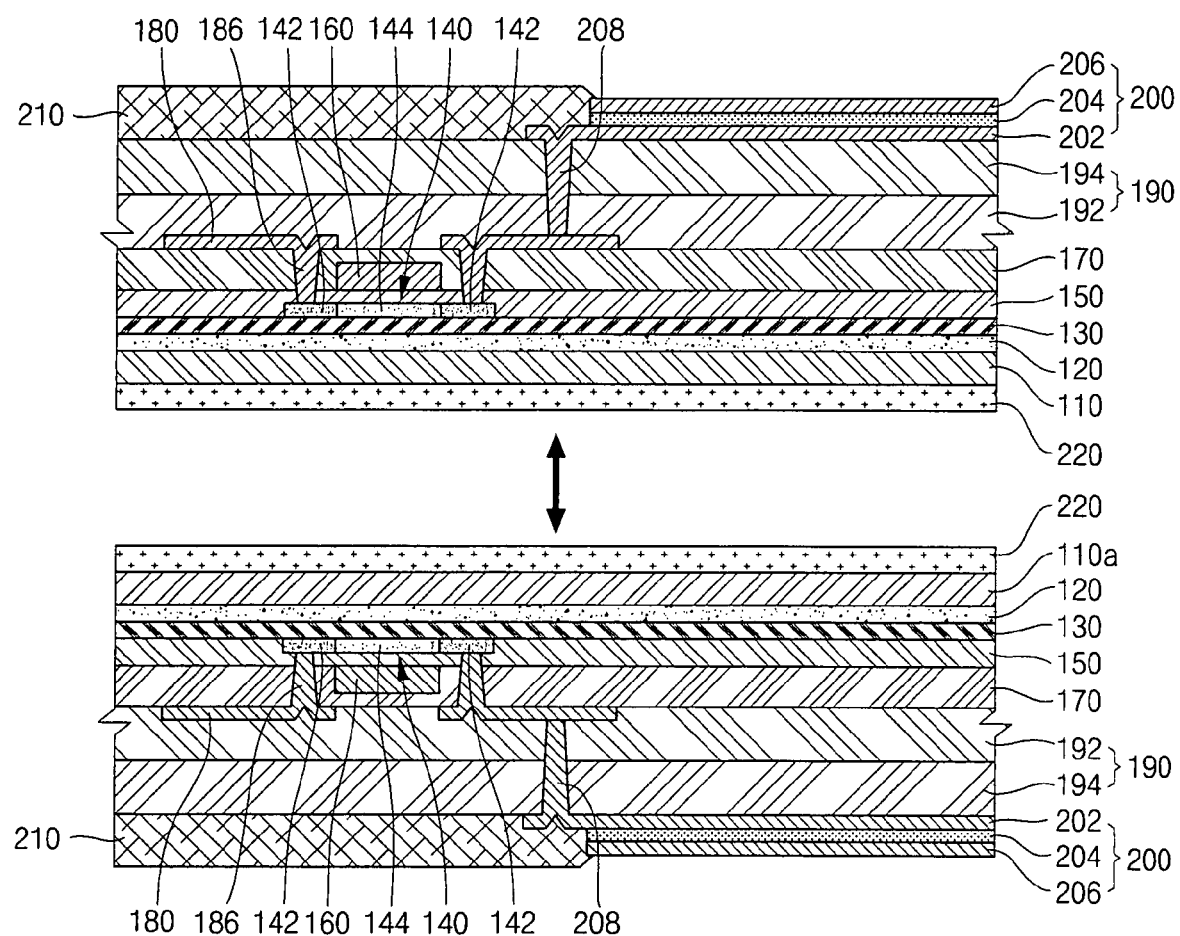

As illustrated in FIG. 4h, which corresponds to step S8 of FIG. 3, first substrate 110 and second substrate 110a, which have been attached and processed, are separated. Adhesive for attaching first substrate 110 and second substrate 110a is eliminated by a sawing machine, and thus first substrate 110 and second substrate 110a are separated. Friction prevention layer 220 still remains on one surface of substrate 110 or 110a after the separation of first substrate 110 and second substrate 110a. Though not shown in the drawings, it is natural that a process for attaching substrates by using a sealing member before sawing or after sawing can be included. A transparent moisture absorption material can be formed on the sealing substrate in order to absorb the moisture.

After step S8 for separating two attached substrates, the method related to fabrication of organic light emitting display of the present invention can be ended. After step S8 for separating two attached substrates, the organic light emitting display can be delivered to a cell test, FPC (Flexible Printed Circuit) bonding, a module test, and a reliability test. The cell test can be performed before sawing step by marking a special area for performing a cell test of the organic light emitting display.

On the other hand, as illustrated above, if the step for separating two sealed substrates is employed as a last process, friction prevention layer 230 can still remain on one surface of substrate 110 or 110a of the fabricated organic light emitting diodes device. Friction prevention layer 230 prevents the UV-ray from transmitting, and protects the surface of first substrate 110 and second substrate 110a from ambient condition.

According to the present invention, for example, if the thickness of substrate 110 or 110a is about 0.5 mm, two substrates 110 and 110a, when sealed and processed, are treated as one sealed substrate, thickness of which is about 1 mm. Therefore, bending or damages can be prevented, as the hardness of substrate, and a process for forming a semiconductor layer, a process for forming an organic light emitting diodes, etc. can be easily performed. After accomplishment of the product, it is separated into an individual one, and a slim substrate of about 0.5 mm can be obtained.

As illustrated in FIG. 4i, which corresponds to step S9 of FIG. 3, friction prevention layer 220 formed on substrate 110 or 110a is removed. That is, friction prevention layer 220 is removed from substrate 110 or 110a by a predetermined chemical solution, or is removed from substrate 110 or 110a by a grinder. Therefore, after friction prevention layer 220 is removed, any friction prevention layer 220 does not remain on the surface of substrate 110 or 110a of the fabricated organic light emitting diodes device, and the thickness thereof becomes smaller. Since the present invention allows friction prevention layer 220 to remain as it is, friction prevention layer 220 blocks a UV-ray or can be used as a protection layer for absorbing external shocks, but since non-transmissive layer 130 is already formed inside organic light emitting display, it is not necessary to remain friction prevention layer 220.

In this way, an organic light emitting diode device of the present invention is formed on a substrate having a thickness of 0.05 mm to 1 mm. There is an advantage that the device can be easily applied to electronic products for display such as mobile phones, PDAs, lap-top computers, computer monitors, and televisions, which requires sliminess.

An organic light emitting display of the present invention includes a non-transmissive layer formed between a buffer layer and a semiconductor layer, or between a substrate and a buffer layer. Therefore, a UV-ray does not transmit into a semiconductor and an organic light emitting diode display during use of a product that was equipped with the organic light emitting display of the present invention.

A method for fabricating an organic light emitting display of the present invention performs a semiconductor process and an organic layer process (naturally, each process includes washing, etching, exposure to lights, developing, thermal process, etc.) simultaneously after attaching two substrates having the thickness of 0.05 mm to 1 mm. Therefore, there is an advantage that the entire process time can be reduced by approximately 50%.

A method for fabricating an organic light emitting display of the present invention includes a process for forming an non-transmissive layer formed between a buffer layer and a semiconductor layer, or between a substrate and a buffer layer. Therefore, there is an advantage that a UV-ray is prevented from transmitting into an opposing substrate despite of exposure to the UV light during the fabrication processes.

A method for fabricating an organic light emitting display of the present invention includes a process for forming a friction prevention layer between two sealed substrates. Therefore, there is an advantage that a semiconductor is not bent or damaged during the fabrication processes.

A method for fabricating an organic light emitting display of the present invention includes a process for forming a friction prevention layer between two sealed substrates, and thus there is an advantage that it becomes possible to prevent the substrates from being damaged by blocking the contacts between the substrates while two substrates are being sealed.

An organic light emitting display according to the present invention and a fabrication method thereof illustrated above are only the embodiments, but the present invention is not limited to these embodiments, and it is to be noted that various modifications can be realized by the person in the art to which the present invention belongs without deviating the scope of the present invention, which is claimed in the claims illustrated as below within the spirit of the present invention.

What is claimed is:

1. An organic light emitting display comprising:
   a substrate;
   an organic light emitting diode for generating light;
   a semiconductor layer disposed between an upper surface of the substrate and the organic light emitting diode;
   an insulation layer disposed between the semiconductor layer and the organic light emitting diode;
   a non-transmissive layer disposed between the substrate and the semiconductor layer, the non-transmissive layer blocking UV-rays, the non-transmissive layer covering the organic light emitting diode and the semiconductor layer; and
   a friction prevention layer contacting a lower surface of the substrate.

2. The organic light emitting display as claimed in the claim 1, further comprising:
   a gate insulation layer disposed between the semiconductor layer and the insulation layer;
   a gate electrode disposed between the gate insulation layer and the insulation layer;
   an inter-layer dielectric layer disposed between the gate electrode and the insulation layer; and a source/drain electrode disposed between the inter-layer dielectric layer and the insulation layer.

3. The organic light emitting display as claimed in the claim 1, comprised of the non-transmissive layer including a protective agent that blocks UV-rays.

4. The organic light emitting display as claimed in the claim 1, comprised of the non-transmissive layer including one selected from the group consisting of a metal that blocks UV-rays, a transparent protective agent that blocks UV-rays, and an opaque protective agent that blocks UV-rays.

5. The organic light emitting display as claimed in the claim 1, comprised of the non-transmissive layer having a thickness between about 500 Angstrom (Å) and about 3,000 Angstrom (Å).

6. The organic light emitting display as claimed in the claim 1, further comprising a buffer vet formed between the non-transmissive layer and the semiconductor layer.

7. The organic light emitting display as claimed in the claim 1, further comprising a buffer layer formed between the non-transmissive layer and the substrate.

8. The organic light emitting display as claimed in the claim 1, comprised of the substrate having a thickness between about 0.05 millimeters and about 1 millimeter.

9. The light emitting display as claimed in the claim 1, comprised of the substrate being made of a material selected from the group consisting of glass, plastic, polymer, and steel.

10. The organic light emitting display as claimed in the claim 1, comprised of the friction prevention layer having a thickness between about 10 micro-meters and about 100 micro-meters.

11. The organic light emitting display as claimed in the claim 1, comprised of the friction prevention layer including one selected from the group consisting of an organic material and an inorganic material.

12. The organic light emitting display as claimed in the claim 1, comprised of the non-transmissive layer including one selected from the group consisting of chromium (Cr), chromium oxide (Cr2O3), aluminum (Al), gold (Au), silver (Ag), magnesium oxide (MgO), and silver alloy.

13. A method for fabricating an organic light emitting display, comprising the steps of:
   providing a first substrate and a second substrate;
   forming a friction prevention layer either on the lower surface of the first substrate or on the upper surface of the second substrate;
   attaching a lower surface of the first substrate to an upper surface of the second substrate through the friction prevention layer;
   forming a non-transmissive layer on both of an upper surface of the first substrate and a lower surface of the second substrate, the non-transmissive layer blocking UV-rays, the non-transmissive layer including one selected from the group consisting of gold (Au) and magnesium oxide (MgO);
   forming a semiconductor layer on the non-transmissive layer;
   forming an insulation layer on the semiconductor layer;

forming an organic light emitting diode on the insulation layer, the organic light emitting diode generating light, the non-transmissive layer covering the organic light emitting diode and the semiconductor layer; and separating the first substrate from the second substrate in a manner that one friction prevention layer remains contacting the lower surface of the first substrate and another friction prevention layer remains contacting the upper surface of the second substrate.

14. The method as claimed in the claim 13, comprised of the non-transmissive layer including a protective agent that blocks UV-rays.

15. The method as claimed in the claim 13, comprised of the non-transmissive layer including one selected from the groups consisting of a metal that blocks UV-rays, a transparent protective agent that blocks UV-rays, and an opaque protective agent that blocks UV-rays.

16. The method as claimed in the claim 13, comprised of the non-transmissive layer having a thickness between about 500 Angstrom (Å) and about 3,000 Angstrom (Å).

17. The method as claimed in the claim 13, comprised of the substrate having a thickness between about 0.05 millimeters and about 1 millimeter.

18. The method as claimed in the claim 13, comprised of the substrate being made of a material selected from the group consisting of glass, plastic, polymer, and steel.

19. The method as claimed in the claim 13, further comprising a step of forming a buffer layer on both of the upper surface of the first substrate and the lower surface of the second substrate before the step for forming the non-transmissive layer.

20. The method as claimed in the claim 13, further comprising a step of forming a buffer layer on the non-transmissive layer before the step for forming the semiconductor layer.

21. The method as claimed in the claim 13, comprised of the friction prevention layer having a thickness between about 10 micro-meters and about 100 micro-meters.

22. The method as claimed in the claim 13, comprised of the friction prevention layer including one selected from the group consisting of an organic material and an inorganic material.

* * * * *